(12) United States Patent  
Yagura

(10) Patent No.: US 7,030,462 B2
(45) Date of Patent: Apr. 18, 2006

(54) HETEROJUNCTION BIPOLAR TRANSISTOR HAVING SPECIFIED LATTICE CONSTANTS

(75) Inventor: Motoji Yagura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/694,889

(22) Filed: Oct. 29, 2003

(65) Prior Publication Data

US 2004/0089875 A1 May 13, 2004

(30) Foreign Application Priority Data

Oct. 30, 2002 (JP) ............................ P2002-316011
Sep. 10, 2003 (JP) ............................ P2003-318668

(51) Int. Cl.
*H01L 27/082* (2006.01)

(52) U.S. Cl. ..................... 257/565; 257/198; 257/631; 257/636; 257/197; 438/312; 438/317

(58) Field of Classification Search ................ 257/198, 257/631, 636, 197; 438/312, 317
See application file for complete search history.

(56) References Cited

U.S. PATENT DOCUMENTS

| 5,116,455 | A | | 5/1992 | Daly |
| 5,682,046 | A | * | 10/1997 | Takahashi et al. ........... 257/198 |
| 6,348,704 | B1 | * | 2/2002 | Teraguchi .................... 257/197 |
| 6,365,477 | B1 | | 4/2002 | Cassler et al. |
| 6,482,711 | B1 | * | 11/2002 | Nguyen et al. ............. 438/317 |
| 2002/0190273 | A1 | | 12/2002 | Delage et al. |

FOREIGN PATENT DOCUMENTS

| EP | 0 746 035 A2 | 12/1996 |
| EP | 0 977 250 A2 | 2/2000 |
| JP | 6-37015 A | 2/1994 |
| JP | 6-37105 A | 2/1994 |
| JP | 2000-323491 A | 11/2000 |
| WO | WO 01/48829 A1 | 7/2001 |

OTHER PUBLICATIONS

Sugahara et al., IEEE, GaAs IC Symposium, pp. 115-118 (1993).
Kawano et al., SA-8-1, "Reliability of C-doped base InGaP/GaAs HBTs," pp. 474-475.
Bahl et al., IEEE, International Election Devices Meeting, pp. 815-818 (1995).
A. Kawano et al.; Reliability of C-doped base InGaP/GaAs HBTs, 1997, General Conference of IEICE (Institute of Electronics, Information and Communication Engineers), SA-8-1, pp. 474-475.

* cited by examiner

*Primary Examiner*—Mai-Huong Tran
(74) *Attorney, Agent, or Firm*—Birch, Stewart, Kolasch & Birch, LLP

(57) ABSTRACT

A Heterojunction Bipolar Transistor, HBT, (100) containing a collector layer (104), a base layer (105) and an emitter layer (106) is constructed such that the collector layer (104), the base layer (105) and the emitter layer (106) have different lattice constants of $a_c$, $a_b$ and $a_e$ respectively, and a value of $a_b$ between values of $a_c$ and $a_e$ (in other words, the values of $a_c$, $a_b$ and $a_e$ satisfy a relationship of $a_c > a_b > a_e$ or $a_c < a_b < a_e$). According to the present invention, the HBT having a high reliability can be realized without altering the existing apparatus and steps for producing the HBT extensively.

16 Claims, 8 Drawing Sheets

HETEROJUNCTION BIPOLAR TRANSISTOR HAVING SPECIFIED LATTICE CONSTANTS

CROSS-REFERENCE TO RELATED APPLICATIONS

The present application claims priority under 35 U.S.C. §119 to Japanese Patent Application Nos. 2002-316011 and 2003-318668 filed on Oct. 30, 2002 and Sep. 10, 2003 respectively and both entitled "HETEROJUNCTION BIPOLAR TRANSISTOR". The contents of these applications are incorporated herein by reference thereto in their entirety.

BACKGROUND OF THE INVENTION

1. Field of the Invention

The present invention relates to a Heterojunction Bipolar Transistor hereinafter also referred to as an "HBT".

2. Description of Related Art

A heterojunction bipolar transistor of III-V compound semiconductors is used for communications such as optical communications, microwave or millimeter wave communications and also comes into practical use in, for example, high-frequency or high-power elements of mobile communication devices or optical communication devices since such heterojunction bipolar transistor shows better properties in high-frequency and higher current drive ability than a bipolar transistor being composed of a single material system.

For putting the HBT into practical use, it is especially important to improve its reliability. Though many approaches have been made for improving the reliability of the HBT, the improvement in the reliability of the HBT is still unsatisfactory since a device sometimes degrades due to the HBT therein if a large current like that used for a power device is applied to the HBT.

Major cause of such degradation is considered as follows. C (carbon), which is generally used as a p-type dopant in place of Be in recent years, doped in a GaAs base layer of an AlGaAs/GaAs HBT has a smaller atomic radius than those of Ga and As of the base layer. Therefore, C strains the base layer and functions as a recombination center resulting in a reduced current gain and a lowered reliability especially in case of high doping of C.

As a way to prevent this problem, it is proposed to add elements of column III or V other than those composing the base layer to the C-doped GaAs base layer. See, for example, Japanese Patent Kokai Publication No. H6-37105. According to this way, the addition of impurities as dopants (e.g. In or Sb) having a larger atomic radius than those of the elements composing the base layer (i.e. Ga and As) can alleviate strain of the base layer to improve reliability of HBT.

As another way, it is also proposed to use two types of impurities composed of elements excepting column III or V as dopants of the GaAs base layer. One of two types of impurities has a larger atomic radius, and the other has a smaller atomic radius compared with the atoms composing the base layer. See, for example, Japanese Patent Kokai Publication No. 2000-323491. According to this way, the addition of the one type of impurities having a larger atomic radius (e.g. Mg) and the other type of impurities having a smaller atomic radius (e.g. C) compared with the atoms composing the base layer (i.e. Ga and As) can alleviate strain of the base layer without forming compounds with Ga or As to improve reliability of HBT.

An example of the HBT according to the latter way in prior art will be described below with reference to the accompanied drawings. (See an embodiment of FIG. 1 in Japanese Patent Kokai Publication No. 2000-323491.) As shown in FIG. 7, a conventional HBT 600 is produced by forming on a semi-insulating GaAs substrate 601, an i-GaAs or i-AlGaAs buffer layer 602, an Si-doped n-GaAs collector layer 603, a C and Mg-doped p-GaAs base layer 604, an Si doped n-AlGaAs or n-InGaP emitter layer 605, and an Si-highly doped $n^+$-GaAs emitter-cap layer 606 in order by using the technique of epitaxial growth. Then, the $n^+$-GaAs emitter-cap layer 606, the n-AlGaAs or n-InGaP emitter layer 605 and the p-GaAs base layer 604 are dry etched appropriately, and a WSi emitter electrode 609, an Ni/AuGe/Au collector electrode 607 and a Ti/Pt/Au base electrode 608 are formed on the $n^+$-GaAs emitter-cap layer 606, the n-GaAs collector layer 603 and the p-GaAs base layer 604 respectively. The HBT 600 is called as an AlGaAs/GaAs HBT when a material of the emitter layer is n-AlGaAs, or as an InGaP/GaAs HBT when a material of the emitter layer is n-InGaP. It is known that the InGaP/GaAs HBT have a longer lifetime and a higher reliability compared with the AlGaAs/GaAs HBT.

In order to dope new element such as In, Sb or Mg in addition to C which is conventionally used as dopants, however, an existing apparatus utilizing the technique of epitaxial growth could not be applied. It becomes necessary to alter the existing apparatus at the minimum otherwise to construct a new apparatus.

Furthermore, the base layer doped with element such as In, Sb or Mg in addition to C has a dry etching rate which is extremely lower than that of the base layer without the element such as In, Sb or Mg. In order to etching the former base layer, it is necessary to supply a gas(es) for dry etching which is different from those conventionally used, or to conduct ion milling. When conducting the ion milling, an etching mask must be formed to have a larger film thickness since the etching mask is etched at an amount almost same as the base layer. (In other words, it is difficult to achieve high selectivity of etching). However, it is difficult to form the etching mask having a large thickness with a fine pattern on an uneven layer. In any case, it is required to alter the existing apparatus and steps for producing the HBT using the technique of epitaxial growth.

The present invention aims to provide an HBT having a high reliability without extensively altering the existing apparatus and steps for producing it.

SUMMARY OF THE INVENTION

In one aspect of the present invention, there is provided a Heterojunction Bipolar Transistor (HBT) containing a collector layer, a base layer and an emitter layer, wherein the collector layer, the base layer and the emitter layer have different lattice constants of $a_c$, $a_b$ and $a_e$ respectively, and a value of $a_b$ is between values of $a_c$ and $a_e$ in other words, the values of $a_c$, $a_b$ and $a_e$ satisfy a numerical relationship of $a_c > a_b > a_e$ or $a_c < a_b < a_e$.

According to the present invention, there is provided the HBT having a high reliability without altering the existing apparatus and steps for producing the HBT extensively. More specifically, the HBT having a larger activation energy can be realized by setting the appropriate relationship between $a_c$, $a_b$ and $a_e$ appropriately so as to determine a deformation due to lattice strain without doping particular elements, and therefore a lifetime of the HBT (i.e. MTTF) becomes longer than that of the conventional HBT.

In the case of a conventional emitter-up HBT, a lattice mismatch ratio of the emitter layer to the base layer is preferably not greater than about 0.3% and more preferably not greater than about 0.1%, and a lattice mismatch ratio of the base layer to the collector layer is preferably not greater than about 0.3% and more preferably not greater than about 0.1%. In the case of a collector-up HBT, a lattice mismatch ratio of the collector layer to the base layer is preferably not greater than about 0.3% and more preferably not greater than about 0.1%, and a lattice mismatch ratio of the base layer to the emitter layer is preferably not greater than about 0.3% and more preferably not greater than about 0.1%.

In this way, the HBT having a further larger activation energy can be realized by selecting a small lattice mismatch ratio so as to limit a degree of the strain, and therefore the lifetime of the HBT becomes larger in a temperature range for a practical use.

When semiconductor layers having lattice constants in descending or increasing order are used as the collector, base and emitter layers, intended electric characteristics of the HBT may not be obtained in some cases since a band structure is not formed as desired. In such cases, the HBT having a long lifetime and a high reliability can be obtained by using an emitter layer and/or an collector layer having two-layered structure to avoid the change of the band structure from the desired one.

The emitter layer can be composed of two layers, i.e. the first and second emitter layers. The first emitter layer contacts with the base layer at a side of the first emitter layer, and the second emitter layer contacts with the first emitter layer at an opposing side of the first emitter layer. The first and second emitter layers have lattice constants $a_{e1}$ and $a_{e2}$ respectively. In such embodiment, a lattice mismatch ratio of the second emitter layer to the base layer may be greater than 0.3% as long as $a_{e2}$ satisfies the relationship of $a_c>a_b>a_e$ or $a_c<a_b<a_e$ in place of $a_e$. According to this embodiment, the change of the band structure from the desired one can be avoided to retain the conventional band structure since a lattice mismatch ratio of the first emitter layer to the base layer can be make sufficiently small, for example, not greater than 0.1%.

This is also applicable for a case in which the collector layer is composed of two layers, i.e. the first and second collector layers. The first collector layer contacts with the base layer at a side of the first collector layer, and the second collector layer contacts with the first collector layer at an opposing side of the first collector layer. The first and second collector layers have lattice constants $a_{c1}$ and $a_{c2}$ respectively. In such embodiment, a lattice mismatch ratio of the second collector layer to the base layer may be greater than 0.3% as long as $a_{c2}$ satisfies the relationship of $a_c>a_b>a_e$ or $a_c<a_b<a_e$ in place of $a_c$. According to this embodiment, the change of the band structure from the desired one can be avoided to retain the conventional band structure since a lattice mismatch ratio of the first collector layer to the base layer can be make sufficiently small, for example, not greater than 0.1%.

It is sufficient that the relationship between $a_c$, $a_b$ and $a_e$ according to the present invention is satisfied at a junction temperature of the HBT so that effects of the present invention can be realized.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

For a reliability test of HBTs, a temperature accelerated test is commonly conducted. This temperature accelerated test (hereinafter, simply referred to as the "reliability test") uses a so-called Arrhenius model which is one of reaction kinetics models. This Arrhenius model is known as the expression of a following equation (1)

$$L = A \cdot \exp(Ea/kT) \quad (1)$$

wherein L is a lifetime (h), A is a constant (h), Ea is an activation energy (eV), k is the Boltzmann constant (about $8.61 \times 10^{-5}$ eV/K), T is a temperature (K). In the present specification, The lifetime L corresponds to a MTTF, i.e. Mean Time To Failure, (h) of HBT, and the temperature T is a value reduced in absolute temperature (K) of a junction temperature $T_j$ (° C.). It is noted that the junction temperature means a temperature at a portion to be subjected to the highest temperature, and generally considered as a temperature of a collector layer as for the HBT. The junction temperature $T_j$ (° C.) in this specification is calculated by a following equation (2)

$$T_j = T_s + R \times P \quad (2)$$

wherein $T_s$ is an environmental temperature (or ambient temperature) (° C.), R is a heat resistance of the HBT (° C./W), P is a power (W) supplied to the HBT (i.e. a value of Collector current $I_c$ (A) multiplied by Collector-emitter voltage $V_{ce}$ (V)).

When the reliability test is conducted at various temperature conditions to determine MTTF, Arrhenius plot of the obtained data (a plot of the logarithmic MTTF against the inverse temperature) generally shows that the plotted data are almost in a line as to a single failure mode. An activation energy Ea is obtained from a slope of the line.

The inventor focuses attention on the activation energy in the reliability test from a new point of view in order to improve the reliability of the HBT.

Figure 7:
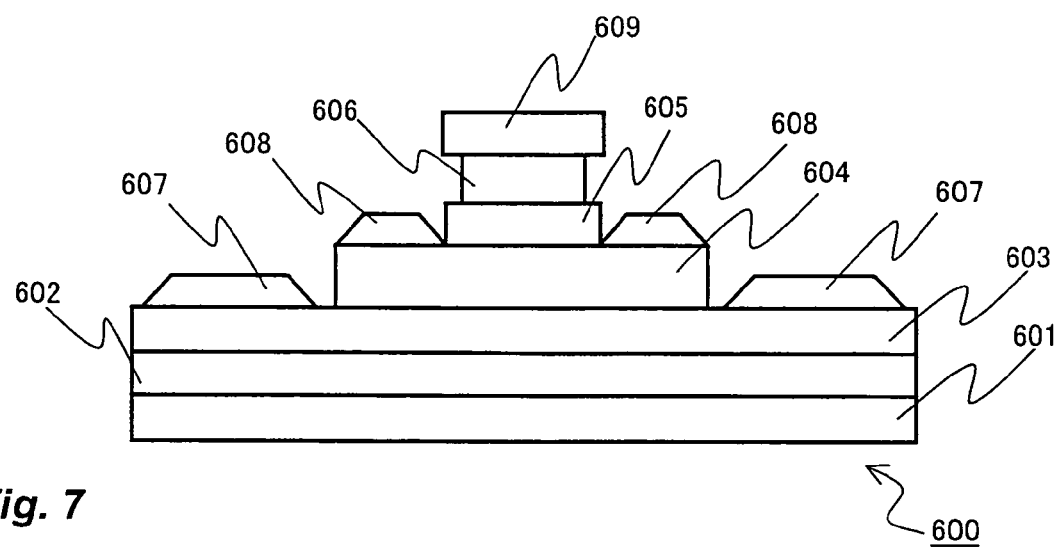
FIG. 7 schematically shows a cross sectional view of an HBT as an example in prior art.
Figure 8:
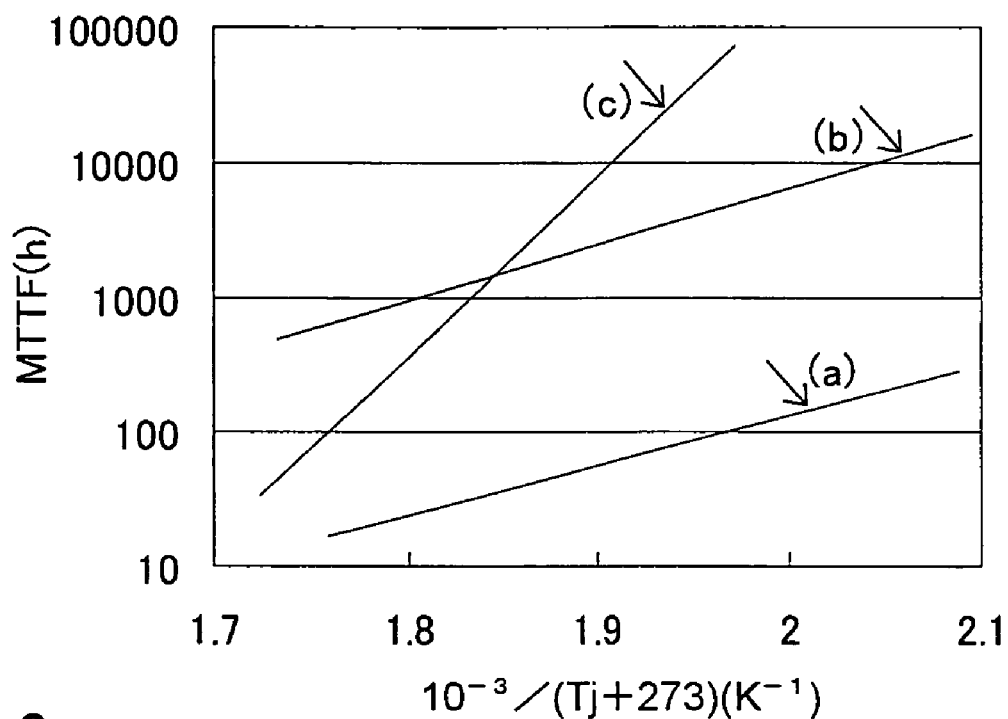
FIG. 8 is a graph showing results of reliability test for HBTs of prior art.

The inventor made an InGaP/GaAs HBT (a) as an example of HBTs. The InGaP/GaAs HBT (a) had a structure similar to the HBT 600 in prior art shown in FIG. 7 except that a base layer of the InGaP/GaAs HBT (a) was doped with only C. Then it was subjected to the reliability test while varying a conjunction temperature in a range from about 270 to 290° C. Electric conditions of the reliability test were follows: Emitter-collector voltage $V_{ce}$=3.0 V; Current density Jc=50 kA/cm$^2$. Then, the obtained data of MTTF (Sample number: N=10) were plotted in Arrhenius plot, and a regression line (a) was calculated by least squares method. A result is shown in FIG. 8. An activation energy calculated from the slope of the line (a) was about 0.7 eV.

Additionally, there has been many reports of an activation energy of HBT$_s$ obtained from the reliability test. For example, it was reported that an InGaP/GaAs HBT having a structure similar to the InGaP/GaAs HBT (a) of which base layer was doped with C had an activation energy of about 0.7. See, for example, Sandeep R. Bahl et al., "Reliability Investigation of InGaP/GaAs Heterojunction Bipolar Transistors", International Electron Devices Meeting Digest, 1995, pp. 815–818.

As another example of HBTs, the inventor also obtained a line (b) by deduction with respect to an InGaP/GaAs HBT (b). The InGaP/GaAs HBT (b) had a structure similar to the HBT 600 shown in FIG. 7 of which base layer was doped with C and Mg. More specifically, the inventor deducted a result of the reliability test of the InGaP/GaAs HBT (b) and obtained the line (b) base on the descriptions of Japanese Patent Kokai Publication No. 2000-323491 and H. Sugahara et al., "IMPROVED RELIABILITY OF AlGaAs/GaAs HETEROJUNCTION BIPOLAR TRANSISTORS WITH A STRAIN-RELAXED BASE", IEEE GaAs IC Symposium Technical Digest, 1993, pp. 115–118. This result is also shown in FIG. 8. Referring FIG. 8, the line (b) of the HBT (b) of which base layer was doped with C and Mg was shifted up and showed a larger MTTF at any temperature with respect to the line (a) of the HBT (a) of which base layer was doped with only C. In other words, it can be understood that a lifetime of the HBT became longer when a base layer was doped with Mg in addition to C compared with the HBT of which base layer was doped with only C. However, an activation energy of HBT (b) calculated from the slope of the line (b) was about 0.7 eV similar to the HBT (a), and there were substantially no difference between their activation energy.

Furthermore, there has been a report of the reliability test for an HBT of which base layer was doped with In or Sb in addition to C. This case also showed a result similar to that of the HBT (b) of which base layer was doped with C and Mg. For example, it has been reported that an AlGaAs/GaAs HBT of which base layer was doped with C and In has, as in the case of the HBT (b), a lifetime longer than the HBT of which base layer was doped with only C. However, it has been also reported that the AlGaAs/GaAs HBT had a small activation energy of 0.45 eV. See, for example, H. Sugahara et al., "IMPROVED RELIABILITY OF AlGaAs/GaAs HETEROJUNCTION BIPOLAR TRANSISTORS WITH A STRAIN-RELAXED BASE", IEEE GaAs IC Symposium Technical Digest, 1993, pp. 115–118.

Furthermore, there has been a report of the reliability test of an InGaP/GaAs HBT (c) of which base layer was doped with only C (Electric conditions: Emitter-collector voltage $V_{ce}$=2.4–2.5 V; Current density $J_c$=60 kA/cm$^2$). See, for example, A. Kawano et al., "Reliability of C-doped base InGaP/GaAs HBTs", 1997 General Conference of IEICE (Institute of Electronics, Information and Communication Engineers), SA-8-1, pp. 474–475, FIG. 4. This result is also shown in FIG. 8 as a line (c). In the HBT (c), the base layer was doped with only C and did not doped with other elements which can reduce strain therein. However, the HBT (c) has not only a larger MTTF at a certain temperature but also a larger activation energy of about 2.0 eV compared with the HBT (a) which was made by the inventor for comparative purpose. The larger activation energy means the larger slope of the line (c), so that the lifetime (MTTF) becomes longer at a lower temperature (i.e. a right side of the graph of FIG. 8). Though the lifetime (MTTF) at the junction temperature $T_j$ of 240° C. for the HBT (b) having the activation energy of about 0.7 eV was about 3×10$^3$ hours, that for the HBT (c) having the activation energy of about 2.0 eV was about 4×10$^4$ hours which is about ten times as large as that for the HBT (b).

On the basis of the comparison in the result of the reliability test for the HBT (c) with other HBTs, especially the HBT (a), the inventor has found that it can be possible to make the lifetime of the HBT longer especially at a low temperature and therefore to improve the reliability of the HBT by increasing an active energy without doping an additional element other than C (or Be) which are conventionally used as a dopant of the base layer.

However, the activation energy are various only for InGaP/GaAs HBT. It is not known why the HBT (c) shows a larger activation energy (which results in the longer lifetime at the low temperature) compared with the HBT (a), the HBT (b) and other HBTs which has been reported (see, in particular, Sandeep R. Bahl et al., "Reliability Investigation of InGaP/GaAs Heterojunction Bipolar Transistors", International Electron Devices Meeting Digest, 1995, pp. 815–818).

The inventor have accomplished the present invention by carefully considering a factor which influences on the active energy.

According to the present invention, there is provided a heterojunction bipolar transistor (HBT) containing a collector layer, a base layer and an emitter layer, wherein the collector layer, the base layer and the emitter layer have different lattice constants of $a_c$, $a_b$ and $a_e$ respectively, and a value of $a_b$ is between values of $a_c$ and $a_e$. It is noted that $a_c$ may larger or smaller than $a_b$ and $a_e$. In other words, $a_c$, $a_b$, and $a_e$ are in descending or increasing order as it is. That is, $a_c$, $a_b$, and $a_e$ satisfy a numerical relationship of $a_c > a_b > a_e$ or $a_c < a_b < a_e$.

In the present invention, the lattice constants of $a_b$, $a_c$ and $a_e$ can be determined as follows. At first, a layer substantially the same as the base layer (hereinafter referred to as a "pseudo-base layer") is grown on a substrate having a (001) surface under the same condition as that for the growth (typically, epitaxial growth) of the base layer in a process for producing the HBT. Thus, a sample containing the pseudo-base layer is obtained. The thickness of the pseudo-base layer is set at 3000 Å. Then, a rocking curve of Bragg reflection at a (004) plane of the sample is measured by scanning from θ to 2θ. Therefore, peak angles of the substrate and the pseudo-base layer thereon are measured. Thus measured peak angles generally contain a little deviance, so that the measured peak angle of the pseudo-base layer can not be available as it is. On the contrast, a difference between these measured peak angles is reliable. Further, an intrinsic value of the peak angle of the substrate is already known in the art. Therefore, the peak angle of the pseudo-base layer can be determined by compensating the measured value. Then, a lattice constant "d" of the pseudo-base layer is calculated from Bragg's equation (2d·sinθ=nλ, wherein d is a lattice constant, λ is a wavelength of X-ray to be used, n is natural number (1, 2, 3 . . . )) by using the peak angle θ of the pseudo-base layer determined above. The calculated lattice constant "d" of the pseudo-base layer can be regarded as the lattice constant $a_b$ of the base layer in practice. The lattice constant $a_c$ of the collector layer and the lattice constant $a_e$ of the emitter layer can be determined in a similar way. It is noted that Philips X-ray diffractometer with a 4-crystal monochromator, Model: MPD1880HR (Incident X-ray: CuK α-ray) can be used as the X-ray apparatus.

According to the present invention, the relation between $a_c$, $a_b$ and $a_e$ is appropriately selected by setting $a_c$, $a_b$ and $a_e$ in descending or increasing order so as to determine a deformation due to lattice strain. As a result, the HBT having a activation energy larger than conventional one is achieved, and therefore it becomes possible to extend a lifetime of the HBT (more specifically MTTF) compared with conventional one. The lifetime of the HBT according to the present invention is extended especially at a lower temperature, i.e. at or near a temperature for practical use.

While not wishing to be bound by any theory, a reason why the present invention can extend the lifetime of the HBT is considered as follows. One cause of degradation of a device is supposed to be movement of dislocation. More specifically, a force due to strain existing in crystal lattice acts on the dislocation, and the dislocation is conventionally moved by this force and finally arrives at, for example, an interface between the base layer and the emitter layer to cause the degradation of the device. In order to move the dislocation, it would be necessary that the dislocation is affected by a force (or energy) larger than an energy barrier which prevent the movement of the dislocation. The present invention, on the contrary, selects the relationship between $a_c$, $a_b$ and $a_e$ appropriately to determine a deformation due to the lattice strain, so that it becomes possible to decrease the force affecting the dislocation and make the dislocation hard to move. As a result, according to the present invention the lifetime of the HBT can be extended.

Furthermore, the present invention does not need to dope the base layer with an additional dopant(s) for relaxing strain as in the conventional HBT which is explained above with reference to FIG. 7. Thus, it is not necessary to alter the existing apparatus and steps utilizing an epitaxial growth technique and an etching technique.

In short, according to the present invention there is provided the HBT having an extended lifetime, in other words a high reliability, without altering the existing apparatus and steps which utilize the epitaxial growth technique and the etching technique.

In one embodiment of the present invention, a lattice mismatch ratio between adjacent two layers among the collector layer, the base layer and the emitter layer, more concretely at least one of and preferably both of a lattice mismatch ratio between the emitter layer and the base layer and a lattice mismatch ratio between the base layer and the collector layer, is not greater than 0.3%, and preferably not greater than 0.1%. The term "lattice mismatch ratio" means a value in percentage terms which is obtained by dividing an absolute difference between the lattice constants of the two layers by the lattice constant of one layer which locates lower than the other. It would be readily understood that the theoretical minimum value of the lattice mismatch ratio is zero based on the definition of the lattice mismatch ratio as above.

More concretely, the HBT of the present invention may be of an emitter-up type or a collector-up type. In the case of the emitter-up HBT, a lattice mismatch ratio (%) of the emitter layer to the base layer (i.e. $|a_e-a_b|/a_b \times 100$) is not greater than about 0.3% and preferably not greater than about 0.1%. That is, $a_e$ and $a_b$ satisfy a relationship of $|a_e-a_b|/a_b \times 100 \leq 0.3$ (%) and preferably satisfy a relationship of $|a_e-a_b|/a_b \times 100 \leq 0.1$ (%). Also in the case of the emitter-up HBT, a lattice mismatch ratio (%) of the base layer to the collector layer (i.e. $|a_b-a_c|/a_c \times 100$) is not greater than about 0.3% and preferably not greater than about 0.1%. That is, $a_b$ and $a_c$ satisfy a relationship of $|a_b-a_c|/a_c \times 100 \leq 0.3$ (%) and preferably satisfy a relationship of $|a_b-a_c|/a_c \times 100 \leq 0.1$ (%).

In the case of the collector-up HBT, a lattice mismatch ratio (%) of the collector layer to the base layer (i.e. $|a_c-a_b|/a_b \times 100$) is not greater than about 0.3% and preferably not greater than about 0.1%. That is, $a_c$ and $a_b$ satisfy a relationship of $|a_c-a_b|/a_b \times 100 \leq 0.3$ (%) and preferably satisfy a relationship of $|a_c-a_b|/a_b \times 100 \leq 0.1$ (%). Also in the case of the collector-up HBT, a lattice mismatch ratio (%) of the base layer to the emitter layer (i.e. $|a_b-a_e|/a_e \times 100$) is not greater than about 0.3% and preferably not greater than about 0.1%. That is, $a_b$ and $a_e$ satisfy a relationship of $|a_b-a_e|/a_e \times 100 \leq 0.3$ (%) and preferably satisfy a relationship of $|a_b-a_e|/a_e \times 100 \leq 0.1$ (%).

It becomes possible to realize the HBT showing a larger activation energy, e.g. an activation energy not smaller than about 2.0 eV and preferably not smaller than about 3.0 eV, by setting the lattice mismatch ratio between the adjacent two layers among the collector layer, the base layer and the emitter layer at not greater than 0.3% and preferably not greater than about 0.1% to select a certain degree of strain appropriately. This HBT shows an extended lifetime at a temperature especially for practical use, and there can be preferably provided an HBT of high reliability having a lifetime which is about ten or more times as large as the conventional one.

In a preferred embodiment of the present invention, in the case of the emitter-up HBT, both of the lattice mismatch ratio of the emitter layer to the base layer and the lattice mismatch ratio of the base layer to the collector layer are not greater than about 0.3% and preferably not greater than about 0.1%. In the case of the collector-up HBT, both of the lattice mismatch ratio of the collector layer to the base layer and the lattice mismatch ratio of the base layer to the emitter layer are not greater than about 0.3% and preferably not greater than about 0.1%. This can provide a further larger activation energy and a further extended lifetime in a temperature range for practical use.

In the present invention, a smaller lattice mismatch ratio is more preferable in a range of greater than 0% and not greater than about 0.3% since the smaller lattice mismatch ratio provides the larger activation energy. However, the lattice mismatch ratio is preferably about 0.01% to 0.3% and more preferably about 0.01% to 0.1% in realistic sense when considering variation in composition of materials for layers as well as variation in concentration of dopants over a thickness on epitaxial growth and over a plane of wafer.

The lattice constants $a_c$, $a_b$ and $a_e$ of the collector layer, the base layer and the emitter layer respectively are variable by adjusting, for example, a concentration of a dopant for doping the respective layers. Especially in the case of the layer made of a ternary compound semiconductor crystal, the lattice constants thereof is variable by adjusting mixing ratios in the compound semiconductor. The adjustments of the dopant concentration and/or the mixing ratios would be readily conducted by those skilled in the art by, for example, controlling a flow rate of a material(s) for doping, flow ratios of source gases and so on appropriately. Though other matters will not be detailed, the HBT of the present invention can be produced by utilizing the existing producing method in the field in either case of the emitter-up HBT or the collector-up HBT.

It is known that the lattice constant of such semiconductor layer is generally increase as a temperature rises. More concretely the lattice constant can be approximately expressed by a following equation (3):

$$\alpha = \alpha_0 \times (1 + \beta \times (T_1 - T_0)) \quad (3)$$

wherein $T_0$ is a standard temperature (K) ($T_0=300$ K), $\alpha_0$ is a lattice constant (Å) at the standard temperature $T_0$, $T_1$ is a certain temperature (K), $\alpha$ is a lattice constant (Å) at the certain temperature $T_1$, and $\beta$ is an expansion coefficient (K$^{-1}$). It is noted that $\beta$ varies depending on the material of the semiconductor layer.

In the present invention, the relationship between the lattice constants $a_c$, $a_b$ and $a_e$ described above (as well as the range of the lattice mismatch ratio calculated therefrom) is not necessarily satisfied at all temperature. It is acceptable that the relationship is satisfied at a junction temperature $T_j$ at the minimum. By ensuring the above relationship at the junction temperature, the effects of the extension of the lifetime and the improvement of the reliability of the HBT can be achieved.

In one embodiment of the present invention, the emitter layer may be composed of two layers of the first and second emitter layers having lattice constants of $a_{e1}$ and $a_{e2}$ respectively, and the first emitter layer is sandwiched between the second emitter layer and the base layer. In such case, the lattice constant $a_{e2}$ of the second emitter layer is used as the lattice constant $a_e$ in the relationship of $a_c>a_b>a_e$ or $a_c<a_b<a_e$. That is, $a_c$, $a_b$ and $a_{e2}$ satisfy a relationship of $a_c>a_b>a_{e2}$ or $a_c<a_b<a_{e2}$. The lattice constant $a_{e2}$ of the second emitter layer may be mismatched with the lattice constant $a_b$ of the base layer largely, and $a_{e2}$ and $a_b$ may satisfy a relationship of $|a_{e2}-a_b|/a_b \times 100 > 0.3$ (%). On the other hand, the lattice constant $a_{e1}$ of the first emitter layer may be a value near the lattice constant $a_b$ of the base layer, and the lattice mismatch ratio between the first emitter layer and the base layer may be, for example, not greater than 0.1%. Further, $a_{e1}$ and $a_b$ may be substantially equal to and lattice matched with each other.

A conventional HBTs in prior art was designed so that the emitter layer and the base layer thereof have the substantially same lattice constant and are lattice matched with each other. In order to satisfy the relationship of $a_c>a_b>a_e$ or $a_c<a_b<a_e$, however, materials for the emitter layer and the base layer are selected to make the emitter layer and the base layer lattice mismatched with each other. As a result, its band gap becomes changed from the conventional HBTs. This may cause change in characteristics of the HBTs since a band structure of the emitter-base is not be formed as desired. The change in the band structure of the emitter-base sometimes undesirable since it brings about change in high frequency characteristic and on-voltage of the HBT and so on.

In such case, it is preferable, not to use the single emitter layer, but to divide the emitter layer into two layers of the first emitter layer and the second emitter layer as described above. The lattice constant $a_{e1}$ of the first emitter layer can be controlled to form the desired band structure (more specifically, the desired band gap of the emitter-base), and the lattice constant $a_{e2}$ of the second emitter layer can be controlled to strain significantly with respect to the lattice constant $a_b$ of the base layer. As a result, the strain due to the lattice mismatch of the second emitter layer to the base layer influences the first emitter layer and the base layer to lower the force acting on dislocation in a junction part between the base layer and the emitter layer, and therefore there can be provided an HBTs having a long lifetime and a high reliability without the change in characteristics of the HBTs.

In another embodiment of the present invention, the collector layer may be composed of two layers of the first and second collector layers having lattice constants of $a_{c1}$ and $a_{c2}$ respectively, and the first collector layer is sandwiched between the second collector layer and the base layer. In such case, the lattice constant $a_{c2}$ of the second collector layer is used as the lattice constant $a_c$ in the relationship of $a_c>a_b>a_e$ or $a_c<a_b<a_e$. That is, $a_{c2}$, $a_b$ and $a_e$ satisfy a relationship of $a_{c2}>a_b>a_e$ or $a_{c2}<a_b<a_e$. The lattice constant $a_{c2}$ of the second collector layer may be mismatched with the lattice constant $a_b$ of the base layer largely, and $a_{c2}$ and $a_b$ may satisfy a relationship of $|a_{c2}-a_b|/a_b \times 100 > 0.3$ (%). On the other hand, the lattice constant $a_{c1}$ of the first collector layer may be a value near the lattice constant $a_b$ of the base layer, and the lattice mismatch ratio between the first collector layer and the base layer may be, for example, not greater than 0.1%. Further, $a_{c1}$ and $a_b$ may be substantially equal to and lattice matched with each other. This embodiment will be advantageous when otherwise a band structure of the collector-base will not be formed as desired and thereby change in characteristics of the HBTs will be brought about. According to this embodiment, effects similarly to the above can be obtained by controlling the lattice constant $a_{c1}$ of the first collector layer to form the desired band structure (more specifically, the desired band gap of the collector base) and by controlling the lattice constant $a_{c2}$ of the second collector layer to strain significantly with respect to the lattice constant $a_b$ of the base layer.

In the embodiment in which the emitter layer and/or the collector layer is composed of two layers, it is also noted that the relationship between the respective lattice constants are not necessarily satisfied at all temperature, and it is acceptable that the relationship is satisfied at a junction temperature $T_j$ at the minimum.

Furthermore, it is noted that not only either of the emitter layer or the collector layer but also both of them may be composed of two layers. The HBT having the emitter layer and/or collector layer in two layers in the embodiment of the present invention may be of an emitter-up type or a collector-up type.

The HBT of the present invention may be a III–V or II–VI HBT. The III–V HBT is structured by using material layers containing at least one element selected from the group III such as In, Ga and Al and at least one element selected from the group V such as P, As, Sb and N. For example, the III–V HBT may contain an InGaP/GaAs heterojunction, an InP/InGaAs heterojunction or the like. The II–VI HBT is structured by using material layers containing at least one element selected from the group II such as Zn and at least one element selected from the group VI such as Se. For example, the II–VI HBT may have a Zn/Se heterojunction or the like.

It is noted that the HBT may have either one of a heterojunction between the emitter layer and the base layer or a heterojunction between the base layer and the collector layer and may also have both of them as known in the field.

The HBT according to the present invention may be of an pnp type or a pnp type.

EMBODIMENTS

Hereinafter, embodiments of the present invention will be described in detail with reference to the drawings.

Embodiment 1

Figure 1A:
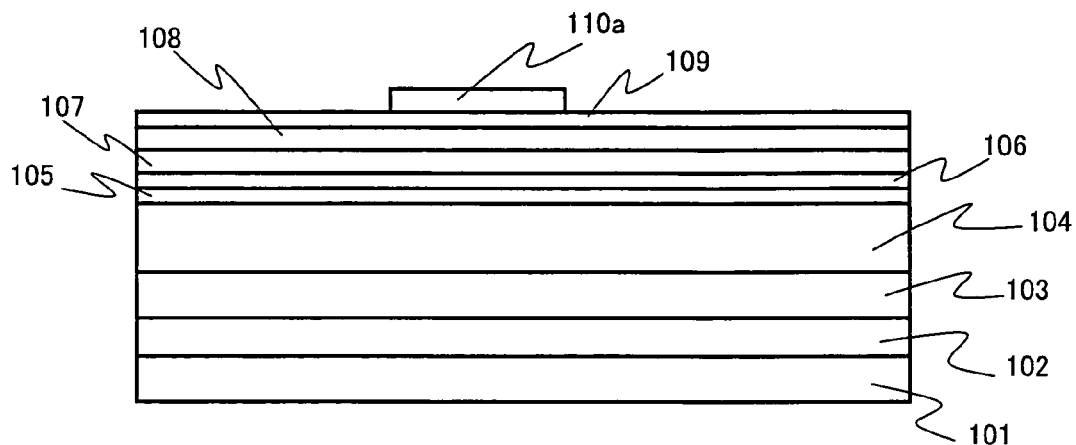
FIGS. 1A to 1C are a process chart schematically showing a cross-sectional view of an HBT of one embodiment of the present invention along a direction of its thickness for illustrating a method of producing the HBT.
Figure 1B:
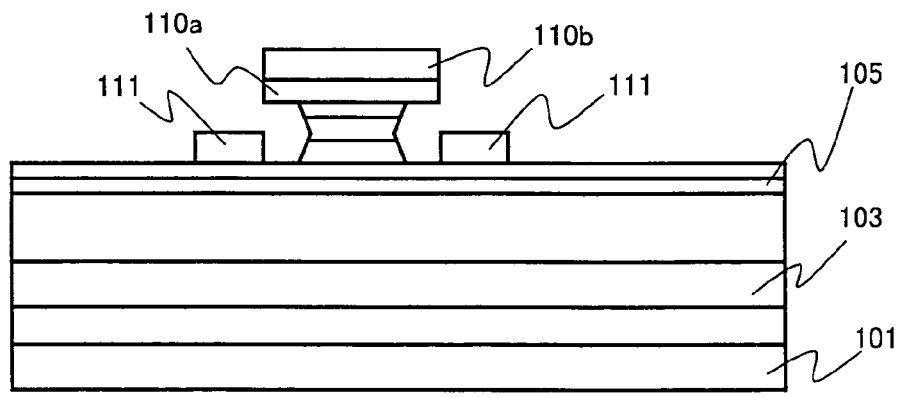
Figure 1C:
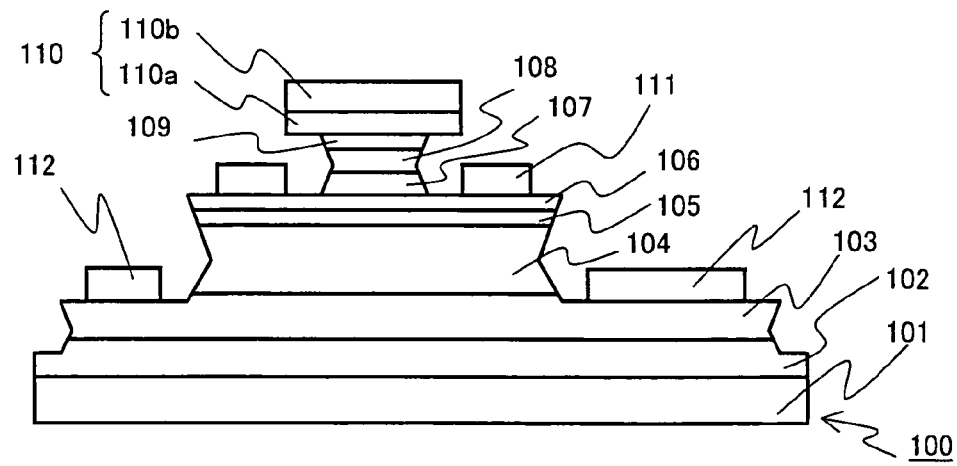

This embodiment relates to an emitter-up InGaP/GaAs HBT and a method for producing the same. FIGS. 1A to 1C are a process chart schematically showing a cross-sectional view along a thickness direction for illustrating a method of producing the HBT 100 of this embodiment.

Referring FIG. 1C, the HBT 100 of this embodiment has a structure containing a substrate 101 (semi-insulating GaAs substrate, thickness of about 600 μm), and a buffer layer 102 (i-GaAs layer, thickness of about 250 μm), a subcollector layer 103 (n-GaAs layer, Si-doped, dopant concentration of about $5\times10^{18}$ cm$^{-3}$, thickness of about 500 nm), a collector layer 104 (n-GaAs layer, Si-doped, dopant concentration of about $2\times10^{16}$ cm$^{-3}$, thickness of about 700 nm), a base layer 105 (p-GaAs layer, C-doped, dopant concentration (i.e. C-concentration) being controlled as described below, thickness of about 80 nm), an emitter layer 106 (n-In$_y$Ga$_{1-y}$P layer wherein y is set as described below, Si-doped, dopant concentration of about $5\times10^{17}$ cm$^{-3}$, thickness of about 25 nm), a contact layer 107 (n-GaAs layer, Si-doped, dopant concentration of about $5\times10^{17}$ cm$^{-3}$, thickness of about 50 nm), a graded layer 108 (n-In$_x$Ga1-$_x$As layer wherein x is from 0 to 0.5 and gradually changes with its height in the growth direction, Si-doped, dopant concentration of about $1\times10^{19}$ cm$^{-3}$, thickness of about 50 nm) and a cap layer 109 (n-In$_z$Ga$_{1-z}$As layer wherein z=0.5, Si-doped, dopant concentration of about $1\times10^{19}$ cm$^{-3}$, thickness of about 50 nm) which are laminated on the substrate in order. In the HBT 100, an emitter electrode 110 (WN/Pt/Ti/Pt/Au or WSi/Pt/Ti/Pt/Au, total thickness of about 300 nm), a base electrode 111 (Pt/Ti/Pt/Au, total thickness of about 200 nm) and a collector electrode 112 (AuGe/Ni/Au, total thickness of about 215 nm) are formed on the cap layer 109, the emitter layer 106 and the subcollector layer 103 respectively as shown in FIG. 1C.

As described above, the thickness of the emitter layer 106 is set at about 25 nm in this embodiment. The thickness of the emitter layer is preferably less than 30 nm since an activation energy Ea is anticipated to become smaller as the thickness of the emitter layer 106 becomes larger.

The HBT 100 is produced as follows. Referring FIG. 1A, the buffer layer 102, the subcollector layer 103, the collector layer 104, the base layer 105, the emitter layer 106, the contact layer 107, the graded layer 108 and the cap layer 109 are formed sequentially in films on the substrate 101 by epitaxial growth using, for example, methods of MOCVD (Metalorganic Chemical Vapor Deposition), MBE (Molecular Beam Epitaxy), CBE (Chemical Beam Epitaxy) and so on.

Such formation of the layers by epitaxial growth can be conducted by using source gases of TEG (Triethyl Gallium) and AsH$_3$ (arsine) for the GaAs layer; TEG, TMIn (Trimethyl Indium) and PH$_3$ (phosphine) for the InGaP layer; TEG, TMIn and AsH$_3$ for the InGaAs layer, respectively. TBA (Tertiary Butyl Phosphine) may be used in place of AsH$_3$. Additionally, a p-type layer is doped with C as a p-type dopant in this embodiment, and TMG (Trimethyl Gallium), for example, can be used as a doping material on forming the C-doped layer. Further, a n-type layer is doped with Si as an n-type dopant in this embodiment, and SiH$_4$ (monosilane) and/or Si$_2$H$_6$ (disilane), for example, can be used as a doping material on forming the Si-doped layer. Other than Si, an n-type layer may be doped with, for example, Sn, Se or Te as an n-type dopant, and TESn (Triethyl Tin), DESe (Diethyl Selenium), DeTe (Diethyl Tellurium), for example, are used as a doping material respectively for this purpose. Flow rates of the source gases as well as the doping materials if doping, a pressure and a temperature in an apparatus for epitaxial growth and so on can be selected by those skilled in the art depending on the composition of the layer to be formed and the dopant concentration if doping.

After obtaining the laminate as described above, a barrier layer 110a (WN or WSi layer, thickness of about 100 nm), which is to be an emitter electrode lower layer, is formed on all over the surface of the cap layer 109 of the laminate by sputtering. Then, a photoresist mask (not shown) is formed on the barrier layer 110a. The barrier layer is etched to have a size of 1 μm width×20 μm length as shown in FIG. 1A. Thereafter, the used photoresist mask is removed.

Next referring to FIG. 1B, the cap layer 109, the graded layer 108 and the contact layer 107 are partially removed by wet etching with a mask of the barrier layer 110a formed in the above, so that an emitter mesa is formed.

Then, a resist mask (not shown) is formed on an exposed surface other than predetermined regions on which the emitter electrode and the base electrode are to be formed. Pt, Ti, Pt and Au are deposited on the laminates in sequence. Thereafter the mask is removed. (This procedure is referred to as a Lift-off method.) Thereby, an emitter electrode upper layer 110b and the base electrode 111 (Pt/Ti/Pt/Au, thickness of about 50 nm per a metal layer) are formed at the same time on the whole surface of the barrier layer 110a and a predetermined region of the emitter layer 106 respectively. As a result, the barrier layer (the emitter electrode lower layer) 110a and the emitter electrode upper layer 110b are stacked to produce the emitter electrode 110.

Next, referring to FIG. 1C, a photoresist mask (not shown) is formed over the emitter electrode 110 and the base electrode 111. The emitter layer 106, the base layer 105 and the collector layer 104 are partially removed by wet etching to expose the subcollector layer 103, so that a base mesa is formed. Thereafter, the used photoresist mask is removed.

Then, the collector electrode 112 (AuGe/Ni/Au, thickness of about 100 nm, about 15 nm and about 100 nm respectively) is formed on a predetermined region of the subcollector layer 103 by a Lift-off method similarly to the above. Thus obtained substrate is subjected to a heat treatment for alloying the collector electrode 112 and the base electrode 111. This ensures not only an ohmic contact between the collector electrode 112 and the subcollector layer 103 and also an ohmic contact between the base electrode 111 and the base layer 105 by the penetration of the alloying layer of the base electrode through the emitter layer 106.

Next, a photoresist mask is formed on an exposed surface other than an etching region for a collector mesa, and wet etching is conducted from the subcollector layer 103 to expose the buffer layer 102, so that a collector mesa is formed as shown in FIG. 1C. Thereafter, the used photoresist mask is removed.

As stated above, the HBT 100 of this embodiment shown in FIG. 1C is produced.

With respect to this HBT 100, a Carbon, C, concentration (dopant concentration) in the p-GaAs layer as the base layer 105 and a mixing ratio y of the n-In$_y$Ga$_{1-y}$P layer as the emitter layer 106 can be selected appropriately such that the lattice constant a$_c$ of the collector layer 104, the lattice constant $a_b$ of the base layer 105, and the lattice constant $a_e$ of the emitter layer 106 are satisfy a relationship of $a_c > a_b > a_e$ or $a_c < a_b < a_e$.

In connection with this embodiment, various HBTs were produced while $a_b$ was varied by setting the C-concentration in the p-GaAs layer as the base layer 105 at about $4 \times 10^{19}$ cm$^{-3}$ or about $1 \times 10^{20}$ cm$^{-3}$ (which will explain below with reference to FIG. 2), and $a_e$ was also varied by changing the mixing ratio y of the n-In$_y$Ga$_{1-y}$P layer as the emitter layer 106 in the range of about 0.44 to 0.52 as shown in Table 1, and $a_c$ was fixed by using the same material of the GaAs layer as the collector layer 104.

TABLE 1

Materials of Base Layer and Emitter Layer

| No. | Base Layer GaAs C-concentration (cm$^{-3}$) | Emitter Layer In$_y$Ga$_{1-y}$P y |
|---|---|---|
| 1 | $4 \times 10^{19}$ | 0.44 |
| 2 | $4 \times 10^{19}$ | 0.46 |
| 3 | $4 \times 10^{19}$ | 0.49 |
| 4 | $4 \times 10^{19}$ | 0.52 |
| 5 | $1 \times 10^{20}$ | 0.44 |
| 6 | $1 \times 10^{20}$ | 0.46 |
| 7 | $1 \times 10^{20}$ | 0.49 |

Figure 2:
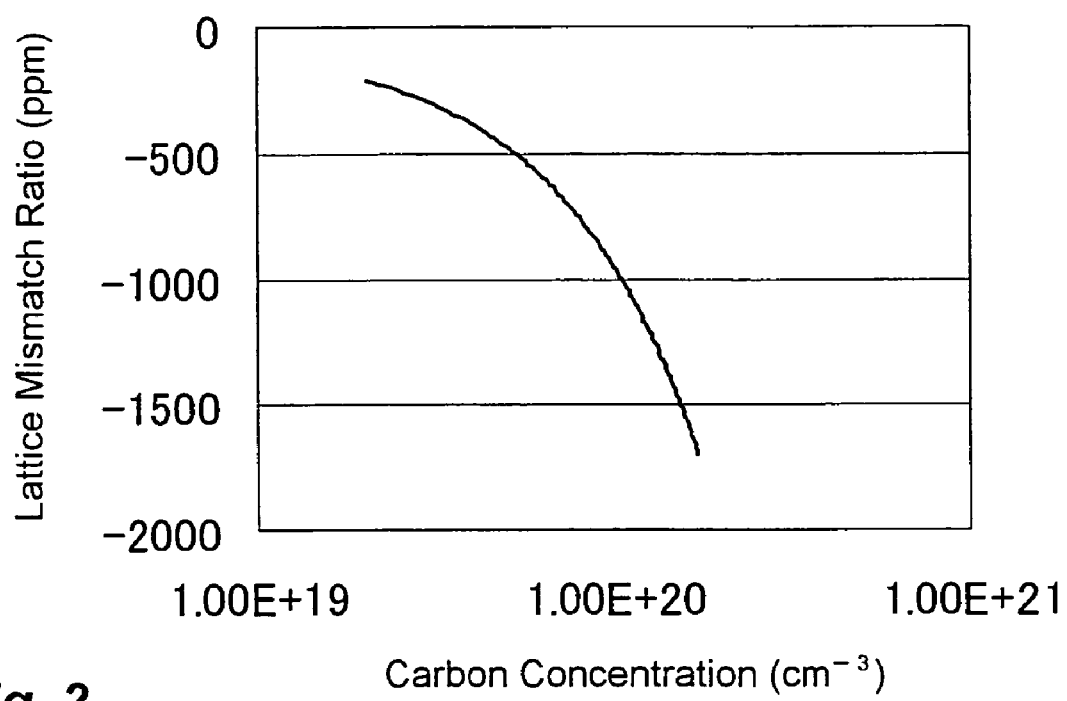
FIG. 2 is a graph showing dependency of a lattice constant of a GaAs layer on a concentration of Carbon in the GaAs layer.

The fact that the lattice constant of the GaAs layer becomes smaller as its C-concentration becomes higher is known in the art. The inventor obtained a correlation between the lattice constant and the C-concentration by measuring the lattice constant at the room temperature (RT, about 20 to 30° C.) according to the procedure described above with the varied C-concentration in the GaAs layer before conducting the present invention. Results are shown in FIG. 2 just for reference. The "Lattice Mismatch Ratio (ppm)" in FIG. 2 was obtained from calculation of $(a^1-a_0)/a_0 \times 10^6$ wherein $a_0$ was a lattice constant of a non-doped GaAs layer and $a_1$ was a lattice constant of a C-doped p-GaAs layer. The lattice constant $a_0$ of the non-doped GaAs layer is about 5.654 Å at the standard temperature $T_0$ (300 K=about 27° C.). Therefore, it will be possible for those skilled in the art to form a GaAs layer having a desired lattice constant based on the correlation in FIG. 2 obtained by the inventor.

As to the HBTs of this embodiment which were produced as described above, the lattice constants $a_c$, $a_b$ and $a_e$ were previously measured or determined according to the procedure described in the above by using an X-ray diffractometer. Results are shown in Table 2. The lattice constants in Table 2 were values at a room temperature (RT, about 20 to 30° C.) and could be considered as the lattice constant α at the standard temperature $T_0$=about 27° C. (see the above equation (3)). On the supposition that the junction temperature $T_j$ was 90° C., a lattice constant α at the junction temperature $T_j$ of 90° C. was calculated for each lattice constant α at the standard temperature $T_0$ in Table 2 by substituting 90° C. for the certain temperature $T_1$ in the equation (3). Results are shown in Table 3. It is noted that β is about $6.86 \times 10^{-6}$ K$^{-1}$ for the GaAs layer, and about $5.0 \times 10^{-6}$ K$^{-1}$ for the InGaP layer. In the Tables 2 and 3, a lattice mismatch ratio of the base layer to the collector layer (i.e. $|a_b-a_c|/a_c \times 100$ (%)) and a lattice mismatch ratio of the emitter layer to the base layer (i.e. $|a_e-a_b|/a_b \times 100$ (%)) are also shown in parenthesis appended to $a_b$ and $a_e$ respectively. (The same applies to following Tables 6 and 7.)

TABLE 2

Lattice Constant (at RT: 20 to 30° C., typically 27° C.)

| No. | Collector Layer GaAs $a_c$ (Å) | Base Layer GaAs $a_b$ (Å) | Emitter Layer In$_y$Ga$_{1-y}$P $a_e$ (Å) |
|---|---|---|---|
| 1 | 5.654 | 5.650 (0.07%) | 5.635 (0.27%) |
| 2 | 5.654 | 5.650 (0.07%) | 5.645 (0.09%) |
| 3 | 5.654 | 5.650 (0.07%) | 5.654 (0.07%) |
| 4 | 5.654 | 5.650 (0.07%) | 5.670 (0.35%) |
| 5 | 5.654 | 5.648 (0.11%) | 5.635 (0.23%) |
| 6 | 5.654 | 5.648 (0.11%) | 5.644 (0.07%) |
| 7 | 5.654 | 5.648 (0.11%) | 5.654 (0.11%) |

TABLE 3

Lattice Constant (at $T_j$: 90° C.)

| No. | Collector Layer GaAs $a_c$ (Å) | Base Layer GaAs $a_b$ (Å) | Emitter Layer In$_y$Ga$_{1-y}$P $a_e$ (Å) |
|---|---|---|---|
| 1 | 5.656 | 5.652 (0.07%) | 5.637 (0.27%) |
| 2 | 5.656 | 5.652 (0.07%) | 5.647 (0.09%) |
| 3 | 5.656 | 5.652 (0.07%) | 5.656 (0.07%) |
| 4 | 5.656 | 5.652 (0.07%) | 5.672 (0.35%) |
| 5 | 5.656 | 5.650 (0.11%) | 5.637 (0.23%) |
| 6 | 5.656 | 5.650 (0.11%) | 5.646 (0.07%) |
| 7 | 5.656 | 5.650 (0.11%) | 5.656 (0.11%) |

Thus obtained HBTs were subjected to a reliability test. Electric conditions of the reliability test were follows: Emitter-collector voltage $V_{ce}$=3.0 V; Current density $J_c$=100 kA/cm$^2$. While varying an environmental temperature (thus the junction temperature) as a parameter, MTTF (i.e. Mean Time $T_0$ Failure) was measured as to each temperature. The Failure of the HBTs was determined when a current gain, hfe, was lowered to 80% or less of the initial value, and the MTTF was a period from starting the test to its failure.

Figure 3A:
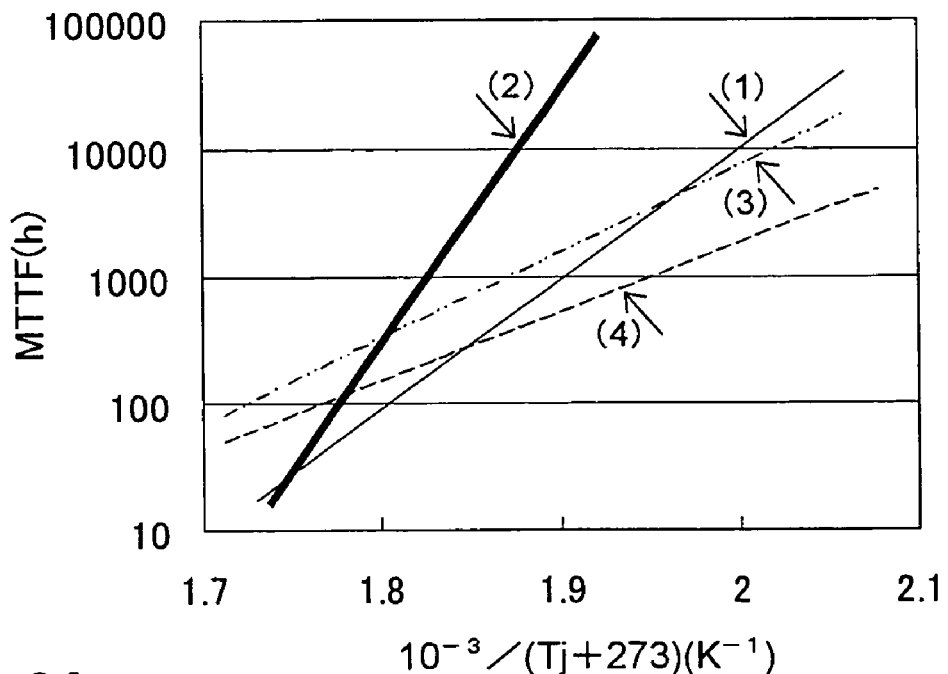
FIGS. 3A and 3B are graphs showing results of reliability test for HBTs of Sample Nos. 1 to 4 and 5 to 7 of the one embodiment of the present invention respectively.
Figure 3B:
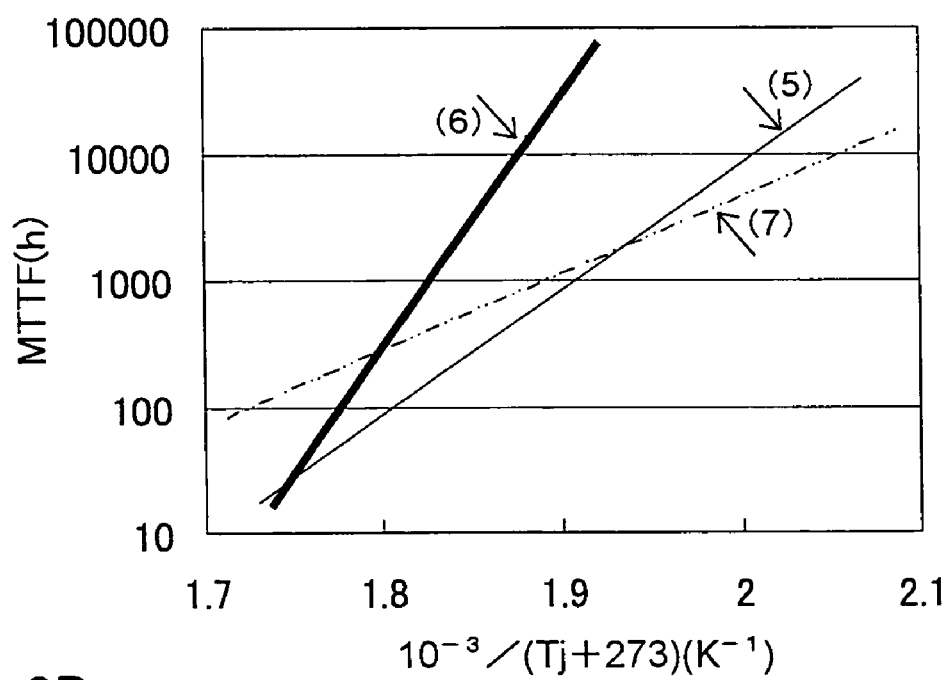

A regression line was obtained for each HBT from Arrhenius plot of the measured MTTFs. The regression lines are shown in FIGS. 3A and 3B. FIG. 3A shows the regression lines of Sample Nos. 1 to 4 (of which C-concentration in the GaAs base layer was about $4 \times 10^{19}$ cm$^{-3}$), and FIG. 3B shows the regression lines of Sample Nos. 5 to 7 (of which C-concentration in the GaAs base layer was about $1 \times 10^{20}$ cm$^{-3}$). (The Sample Nos. being designated with an arrow in the attached figures.) In addition, an activation energy Ea for each HBT was obtained from its regression line. Results are shown in Table 4.

TABLE 4

Activation Energy Ea

| No. | Ea (eV) |
|---|---|
| 1 | 2.2 |
| 2 | 3.2 |
| 3 | 1.1 |
| 4 | 0.9 |
| 5 | 2.0 |
| 6 | 3.0 |
| 7 | 0.7 |

Among the HBTs of Sample Nos. 1 to 7, referring to Tables 2 and 3, the HBTs of Sample Nos. 1, 2, 5 and 6 were examples of the present invention since these HBTs satisfied a relationship of $a_c>a_b>a_e$. On the other hand, the HBTs of Sample Nos. 3, 4 and 7 were comparative examples.

It can be understood from Tables 2 to 4 that a higher Ea was obtained when the relationship of $a_c>a_b>a_e$ was satisfied (Sample Nos. 1, 2, 5 and 6). Ea had a tendency to become smaller when the value of $a_e$ became too small compared with the value of $a_b$ though the relationship of $a_c>a_b>a_e$ was satisfied (compare Sample Nos. 1 and 5 with Nos. 2 and 6 respectively). However, when the lattice mismatch ratio of the emitter layer to the base layer was preferably not larger than 0.3% while satisfying the above relationship (Sample Nos. 1, 2, 5 and 6), the obtained value of Ea was not less than 2.0 eV, and extension of lifetime (MTTF) of the HBTs at a low temperature was confirmed. In particular, the values of Ea for Sample Nos. 2 and 6 were not less than 3.0 eV. Thus, the HBTs having the especially high reliability were realized when the lattice mismatch ratio of the emitter layer to the base layer was not larger than 0.1%.

When compared Sample Nos. 1 and 2 with No. 5 and 6 respectively under the condition of the same value of $a_e$ and different values of $a_b$, Ea of Sample Nos. 1 and 2 of which $a_b$ was closer to $a_c$ were higher than that of Sample Nos. 5 and 6. This would be brought about by the smaller lattice mismatch ratio of the base layer to the collector layer. Thus, the lattice mismatch ratio of the base layer to the collector layer was preferably not larger than about 0.3% and more preferably not larger than about 0.1%.

With respect to the HBTs of Sample Nos. 2 and 6, a high activation energy Ea not lower than 3.0 eV was obtained. MTTF of the HBTs of Sample Nos. 2 and 6 were about 1.5 million hours and about 1.3 million hours respectively (not shown), provided that a junction temperature $T_j$ was 230° C. The HBT (c) had the highest activation energy among the HBTs in prior art, and MTTF thereof was about 0.12 million hours at the junction temperature $T_j$ of 230° C. (see the line (c) of FIG. 8). The MTTF of this embodiment was about ten times longer than that of the HBT (c) even though electric conditions in a reliability test of the HBT (c) was milder than that of this embodiment. Furthermore, it was confirmed that MTTF of this embodiment was 100 or more times longer than that of the HBT (c) at a lower junction temperature such as about 200° C.

Figure 4:
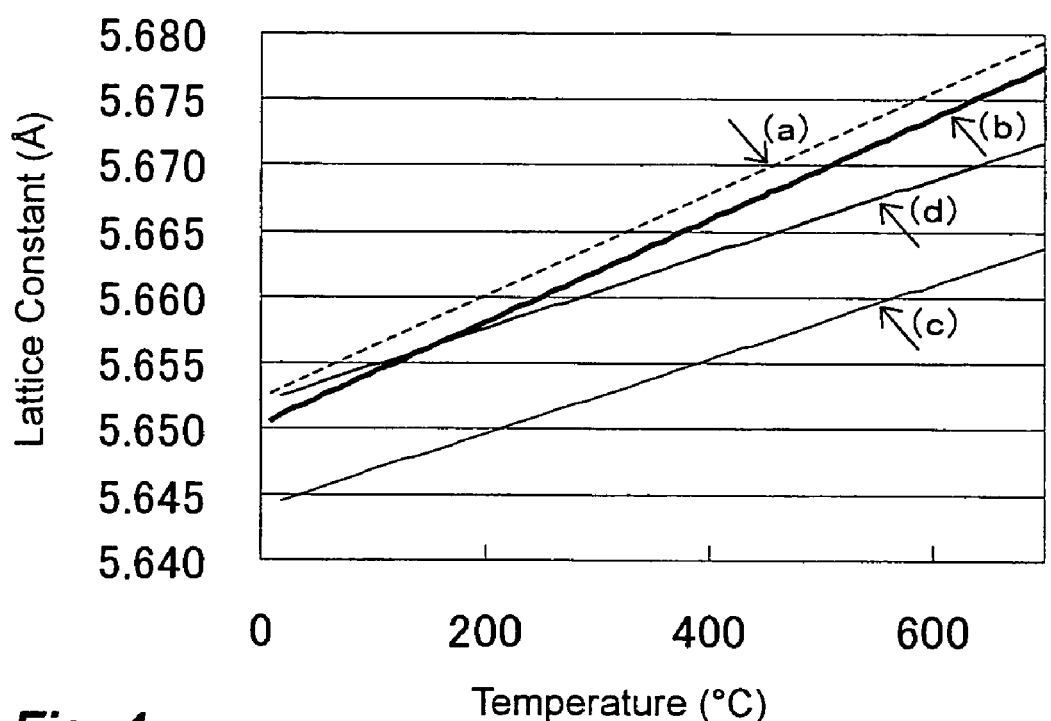
FIG. 4 is a graph showing dependency of a lattice constant on a temperature for (a) a GaAs layer, (b) a C-doped GaAs layer (C-concentration of $4 \times 10^{19}$ cm$^{-3}$), (c) an In$_y$Ga$_{1-y}$P layer (y=0.46), and (d) an In$_y$Ga$_{1-y}$P layer (y=0.48)

In the above, improvement in device characteristics was considered based on the relationship between $a_c$, $a_b$ and $a_e$ (and the value of the lattice mismatch ratio) at the room temperature and the junction temperature. Next, temperature dependency of the lattice constant will be also considered. A lattice constant increases almost linearly in proportion to a temperature as it is understandable from the above equation (3). As an example, a line showing temperature dependency of the lattice constant with respect to each layer used in the HBT of Sample No. 2 are shown in FIG. 4. A line (a) corresponds to the lattice constant $a_c$ of the GaAs layer (non-doped, the collector layer). A line (b) corresponds to the lattice constant $a_b$ of the C-doped GaAs layer (C-concentration of $4\times10^{19}$ cm$^{-3}$, the base layer). A line (c) corresponds to the lattice constant $a_e$ of the In$_y$Ga$_{1-y}$P layer (y=0.46, the emitter layer). In addition, a line (d) is also shown in FIG. 4, which corresponds to a lattice constant $a_e$ of an In$_y$Ga$_{1-y}$P layer (y=0.48, an emitter layer), is also shown in FIG. 4 for comparison.

As understood from the lines (a) to (c), the HBT of Sample No. 2 satisfied the relationship of $a_c>a_b>a_e$ in the whole range of the temperature shown in the figure. Thus, the HBT having the long lifetime and the high reliability was surely realized.

Next, an HBT containing the In$_y$Ga$_{1-y}$P layer (y=0.48) of the line (d) in the place of the In$_y$Ga$_{1-y}$P layer (y=0.46) of the line (c) in the HBT of Sample No. 2 will be discussed. In such case, the line (d) located over the line (b) in the temperature range less than 120° C. Therefore, $a_c$, $a_b$ and $a_e$ are in $a_c>a_b$ and $a_b<a_e$ and the relationship of $a_c>a_b>a_e$ was not satisfied in this range. On the contrast, the line (d) located under the line (b) in the temperature range not less than 120° C., and the relationship of $a_c>a_b>a_e$ was satisfied. Thus, the HBT having the long lifetime and the high reliability was obtained as long as its junction temperature was not less than 120° C.

As described above, the present invention can be conducted so that the relationship of $a_c>a_b>a_e$ is satisfied at least at the junction temperature of the HET while considering influence of the temperature to the lattice constant(s). For example, in a case of Heat Resistance R=60° C./W, Collector-emitter voltage $V_{ce}=3$ V, and Collector current $I_c=300$ mA this will result in the junction temperature $T_j$=about 80° C., and therefore it is desirable to select the lattice constants $a_b$, $a_e$ and $a_c$ to satisfy the predetermined relationship at least at this temperature.

Embodiment 2

Figure 5:
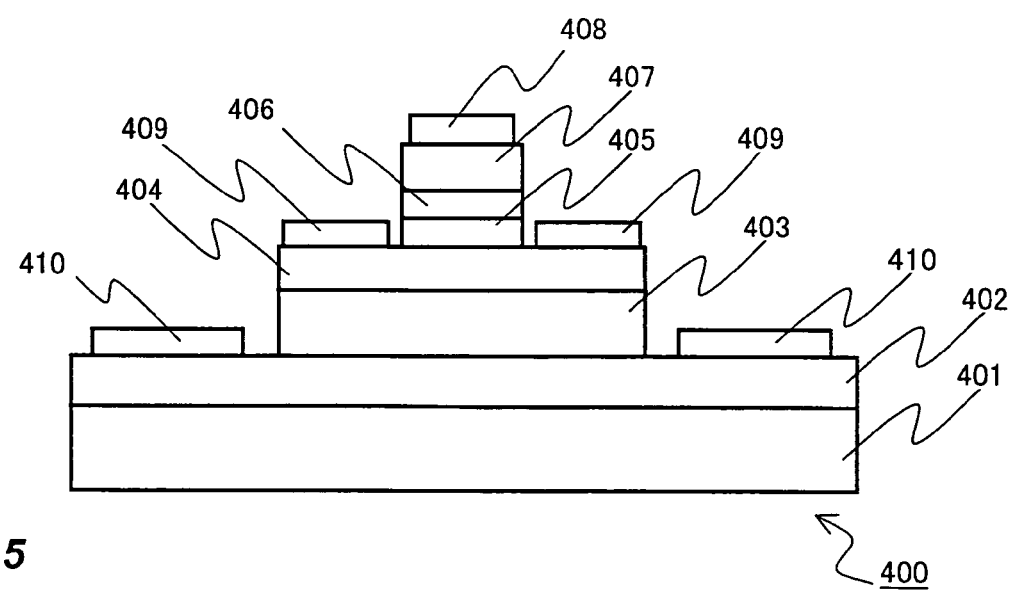
FIG. 5 schematically shows a cross sectional view of an HBT in other embodiment of the present invention.

This embodiment relates to an emitter-up InP/InGaAs HBT and a method for producing the same. FIG. 5 schematically shows a cross-sectional view of the HBT 400 of the present embodiment.

Referring FIG. 5, the HBT 400 of this embodiment has a structure containing a substrate 401 (semi-insulating InP substrate, thickness of about 625 μm), and a subcollector layer 402 (n-In$_w$Ga$_{1-w}$As layer wherein w is 0.53, Si-doped, dopant concentration of about $5\times10^{18}$ cm$^{-3}$, thickness of about 400 nm), a collector layer 403 (i-In$_y$Ga$_{1-y}$As layer wherein y is set as described below, undoped, thickness of about 300 nm), a base layer 404 (p-In$_x$Ga$_{1-x}$As layer wherein x is set as described below, C-doped, dopant concentration of about $1\times10^{19}$ cm$^{-3}$, thickness of about 50 nm), an emitter layer 405 (n-InP layer, Si-doped, dopant concentration of about $3\times10^{17}$ cm$^{-3}$, thickness of about 25 nm), a contact layer 406 (n-InP layer, Si-doped, dopant concentration of about $2\times10^{19}$ cm$^{-3}$, thickness of about 20 nm), and a cap layer 407 (n-In$_z$Ga$_{1-z}$As layer wherein z= 0.53, Si-doped, dopant concentration of about $3\times10^{19}$ cm$^{-3}$, thickness of about 100 nm) which are laminated on the substrate in order. In the HBT 400, an emitter electrode 408, a base electrode 409 and a collector electrode 410 (Ti/Pt/Au, thickness of about 50 nm, about 50 nm and about 100 nm for respective metal layer and total thickness of about 200 nm) are formed on the cap layer 407, the base layer 404 and the subcollector layer 402 respectively as shown in FIG. 5.

The HBT 400 of this embodiment would be produced by those skilled in the art by reference to the descriptions of the method for producing the HBT 100 in the embodiment 1.

With respect to this HBT 400, a mixing ratio y of the In$_y$Ga$_{1-y}$As layer as the collector layer 403 and a mixing ratio x of the In$_x$Ga$_{1-x}$As layer as the base layer 404 can be selected appropriately such that the lattice constant $a_c$ of the collector layer 403, the lattice constant $a_b$ of the base layer 404, and the lattice constant $a_e$ of the emitter layer 405 are satisfy a relationship of $a_c>a_b>a_e$ or $a_c<a_b<a_e$.

In connection with this embodiment, various HBTs were produced while $a_b$ was varied by setting the mixing ratio x of the In$_x$Ga$_{1-x}$As layer as the base layer 404 at about 0.52 or about 0.54, $a_c$ was also varied by changing the mixing ratio y of the In$_y$Ga$_{1-y}$As layer as the collector layer 403 in the range of about 0.48 to 0.56 as shown in Table 5, and $a_e$ was fixed by using the same material of the InP layer as the emitter layer 405.

TABLE 5

Materials of Collector Layer and Base Layer

| No. | Collector Layer $In_yGa_{1-y}As$ y | Base Layer $In_xGa_{1-x}As$ x |
|---|---|---|
| 8 | 0.53 | 0.52 |
| 9 | 0.51 | 0.52 |
| 10 | 0.48 | 0.52 |
| 11 | 0.56 | 0.54 |
| 12 | 0.55 | 0.54 |
| 13 | 0.53 | 0.54 |

As to the HBTs of this embodiment which were produced as described above, the lattice constants $a_c$, $a_b$ and $a_e$ were previously measured or determined similarly to the embodiment 1. Results are shown in Table 6. The lattice constants in Table 6 were values at a room temperature (RT, about 20 to 30° C.) and could be considered as the lattice constant α at the standard temperature $T_0$=about 27° C. (see the above equation (3)). On the supposition that the junction temperature $T_j$ was 150° C., a lattice constant at the junction temperature $T_j$ of 150° C. was calculated for each lattice constant at the standard temperature $T_0$ in Table 6 by the equation (3) similarly to the embodiment 1. Results are shown in Table 7. It is noted that β is about $5.69 \times 10^{-6}$ K$^{-1}$ for the InGaAs layer, and about $4.75 \times 10^{-6}$ K$^{-1}$ for the InP layer.

TABLE 6

Lattice Constant (at RT: 20 to 30° C., typically 27° C.)

| No. | Collector Layer $In_yGa_{1-y}As$ $a_c$ (Å) | Base Layer $In_xGa_{1-x}As$ $a_b$ (Å) | Emitter Layer InP $a_e$ (Å) |
|---|---|---|---|
| 8 | 5.869 | 5.863 (0.10%) | 5.869 (0.10%) |
| 9 | 5.858 | 5.863 (0.09%) | 5.869 (0.10%) |
| 10 | 5.847 | 5.863 (0.27%) | 5.869 (0.10%) |
| 11 | 5.882 | 5.873 (0.15%) | 5.869 (0.07%) |
| 12 | 5.878 | 5.873 (0.09%) | 5.869 (0.07%) |
| 13 | 5.869 | 5.873 (0.07%) | 5.869 (0.07%) |

TABLE 7

Lattice Constant (at $T_j$: 150° C.)

| No. | Collector Layer $In_yGa_{1-y}As$ $a_c$ (Å) | Base Layer $In_xGa_{1-x}As$ $a_b$ (Å) | Emitter Layer InP $a_e$ (Å) |
|---|---|---|---|
| 8 | 5.873 | 5.867 (0.10%) | 5.872 (0.09%) |
| 9 | 5.862 | 5.867 (0.09%) | 5.872 (0.09%) |
| 10 | 5.851 | 5.867 (0.27%) | 5.872 (0.09%) |
| 11 | 5.886 | 5.877 (0.15%) | 5.872 (0.09%) |
| 12 | 5.882 | 5.877 (0.09%) | 5.872 (0.09%) |
| 13 | 5.873 | 5.877 (0.07%) | 5.872 (0.09%) |

Figure 6A:
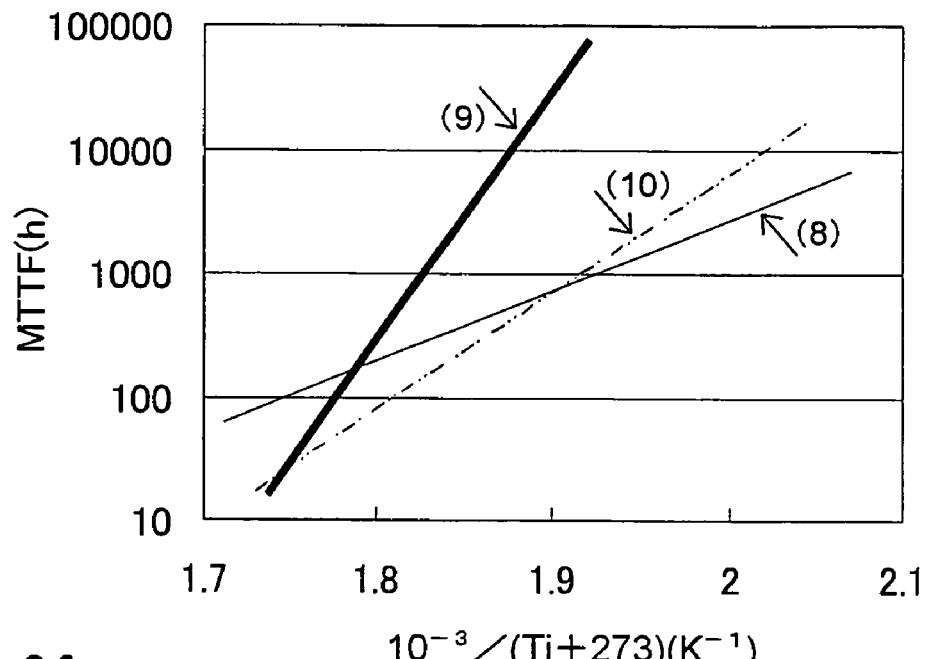
FIGS. 6A and 6B are graphs showing results of reliability test for HBTs of Sample Nos. 8 to 10 and 11 to 13 of the other embodiment of the present invention respectively.
Figure 6B:
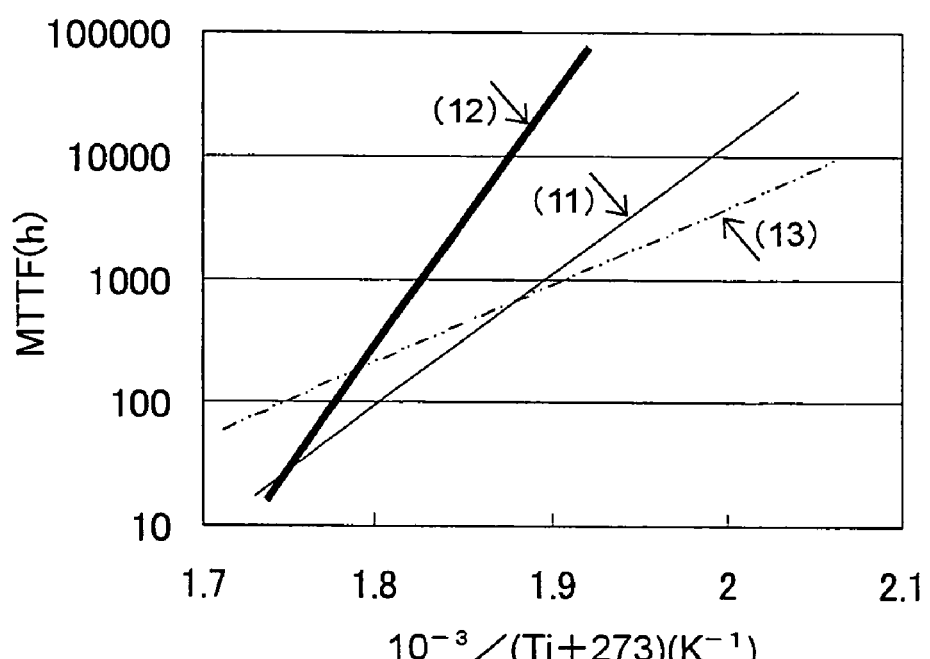

Thus obtained HBTs were subjected to a reliability test similarly to the embodiment 1. A regression line was obtained for each HBT from Arrhenius plot of the measured MTTFs. The regression lines are shown in FIGS. 6A and 6B. FIG. 6A shows the regression lines of Sample Nos. 8 to 10 (of which mixing ratio x of the $In_xGa_{1-x}As$ layer was about 0.52), and FIG. 6B shows the regression lines of Sample Nos. 11 to 13 (of which mixing ratio x of the $In_xGa_{1-x}As$ layer was about 0.54). In addition, an activation energy Ea for each HBT was obtained from its regression line. Results are shown in Table 8.

TABLE 8

Activation Energy Ea

| No. | Ea (eV) |
|---|---|
| 8 | 0.8 |
| 9 | 3.1 |
| 10 | 2.0 |
| 11 | 2.1 |
| 12 | 3.2 |
| 13 | 0.9 |

Among the HBTs of Sample Nos. 8 to 13, referring to Tables 6 and 7, the HBTs of Sample Nos. 9 to 12 were examples of the present invention since the HBTs of the Sample Nos. 9 and 10 satisfied a relationship of $a_c < a_b < a_e$, and the HBTs of Sample Nos. 11 and 12 satisfied a relationship of $a_c > a_b > a_e$. On the other hand, the HBTs of Sample Nos. 8 and 13 were comparative examples.

It can be understood from Tables 6 to 8 that a higher Ea was obtained when the relationship of $a_c < a_b < a_e$ (Sample Nos. 9 and 10) or a relationship of $a_c > a_b > a_e$ (Sample Nos. 11 and 12) was satisfied. Ea had a tendency to become smaller when the value of $a_c$ was much smaller than the value of $a_b$ though the relationship of $a_c < a_b < a_e$ was satisfied (compare Sample Nos. 9 with 10). In addition, Ea also had a tendency to become smaller when the value of $a_c$ was much larger than the value of $a_b$ though the relationship of $a_c > a_b > a_e$ was satisfied (compare Sample Nos. 11 with 12). However, when the lattice mismatch ratio of the base layer to the collector layer was preferably not larger than 0.3% while satisfying the above relationship (Sample Nos. 9, 10, 11 and 12), the obtained value of Ea was not less than 2.0 eV, and extension of lifetime (MTTF) of the HBTs at a low temperature was confirmed. In particular, the values of Ea for Sample Nos. 9 and 12 were not less than 3.0 eV. Thus, the HBTs having the especially high reliability were realized when the lattice mismatch ratio of the base layer to the collector layer was not larger than 0.1%.

Similarly to the above, the lattice mismatch ratio of the emitter layer to the base layer was preferably not larger than about 0.3% and more preferably not larger than about 0.1%.

The two embodiments of the present invention is described in the above. The present invention, however, should not be limited to these embodiments and will be modified in various ways. The HBT of the present invention may have any suitable structure and may be made of any appropriate materials as long as the relationship of $a_c > a_b > a_e$ or $a_c < a_b < a_e$.

The above embodiments 1 and 2 describe the emitter-up HBTs in which the collector layer, the base layer and the emitter layer are laminated on the substrate in the order named so that the emitter layer locates over the collector layer and the base layer with respect to the substrate. The present invention, however, should not be limited to this, and can be applicable to a collector-up HBTs in which the emitter layer, the base layer and the collector layer are laminated on the substrate in the order named so that the collector layer locates over the emitter layer and the base layer with respect to the substrate. In the latter case, at least one of and preferably both of the lattice mismatch ratio of the collector layer to the base layer and the lattice mismatch ratio of the base layer to the emitter layer are not larger than 0.3%, and preferably not larger than 0.1%.

Further, the HBTs of the embodiments 1 and 2 fall into single HBTs in which a wide band gap is formed in only the emitter layer. However, the present invention can be applied to double HBTs in which a wide band gap is formed in the collector layer as well as the emitter layer. In the embodiment 1, for example, the collector layer may be other layer such as an InGaP layer. In such case, it is possible to obtain the HBT improved in reliability by appropriately controlling the lattice constants of respective layers to satisfy the relationship of $a_c > a_b > a_e$ or $a_c < a_b < a_e$.

The HBT of the embodiment 1 is provided with the buffer layer, the subcollector layer, the contact layer, the graded layer and the cap layer, and the HBT of the embodiment 2 is provided with the subcollector layer, the contact layer and the cap layer. However, It is noted that these layers are not necessary to conduct the present invention.

Embodiment 3

This embodiment is a variant of the embodiment 1 and relates to an HBT including an emitter composed of two layers. Referring to the HBT 100 of FIG. 1C, the HBT of this embodiment has a structure substantially same as the HBT 100 except that the emitter layer 106 is composed of the first emitter layer 106a (n-$In_yGa_{1-y}P$ layer wherein y=0.46, Si-doped, dopant concentration of about $5 \times 10^{17}$ cm$^{-3}$, thickness of about 25 nm) which is deposited on the base layer 105, and the second emitter layer 106b (n-$In_{y'}Ga_{1-y'}P$ layer wherein y'=0.43, Si-doped, dopant concentration of about $5 \times 10^{17}$ cm$^{-3}$, thickness of about 25 nm) which is deposited on the first emitter layer 106a. In this embodiment, the C-concentration in the p-GaAs layer as the base layer 105 is about $1 \times 10^{20}$ cm$^{-3}$. The HBT of this embodiment would be produced by those skilled in the art by reference to the above embodiment 1.

As to the HBT of this embodiment which was produced according to the above, the lattice constants $a_c$, $a_b$ and $a_e$ were previously measured or determined similarly to the embodiment 1. Results are shown in Table 9. The lattice constants in Table 9 were values at a room temperature (RT, about 20 to 30° C.) and could be considered as the lattice constant $\alpha_0$ at the standard temperature $T_0$=about 27° C. (see the above equation (3)). On the supposition that the junction temperature $T_j$ was 85° C., a lattice constant at the junction temperature $T_j$ of 85° C. was calculated for each lattice constant at the standard temperature $T_0$ in Table 9 by the equation (3) similarly to the embodiment 1. Results are shown in Table 10. In the Tables 9 and 10, a lattice mismatch ratio of the base layer to the collector layer (i.e. $|a_b - a_c|/a_c \times 100$ (%)), a lattice mismatch ratio of the first emitter layer to the base layer (i.e. $|a_{e1} - a_b|/a_b \times 100$ (%)) and a lattice mismatch ratio of the second emitter layer to the base layer (i.e. $|a_{e2} - a_b|/a_b \times 100$ (%)) are also shown in parenthesis appended to $a_b$, $a_{e1}$ and $a_{e2}$ respectively.

TABLE 9

Lattice Constant (at RT: 20 to 30° C., typically 27° C.)

| No. | Collector Layer GaAs $a_c$ (Å) | Base Layer GaAs $a_b$ (Å) | First Emitter Layer $In_yGa_{1-y}P$ $a_{e1}$ (Å) | Second Emitter Layer $In_{y'}Ga_{1-y'}P$ $a_{e2}$ (Å) |
|---|---|---|---|---|
| 14 | 5.654 | 5.648 (0.11%) | 5.645 (0.05%) | 5.630 (0.32%) |

TABLE 10

Lattice Constant (at $T_j$: 85° C.)

| No. | Collector Layer GaAs $a_c$ (Å) | Base Layer GaAs $a_b$ (Å) | First Emitter Layer $In_yGa_{1-y}P$ $a_{e1}$ (Å) | Second Emitter Layer $In_{y'}Ga_{1-y'}P$ $a_{e2}$ (Å) |
|---|---|---|---|---|
| 14 | 5.656 | 5.650 (0.11%) | 5.647 (0.05%) | 5.632 (0.32%) |

It can be understood from Tables 9 and 10 that the lattice constant $a_c$ of the collector layer, the lattice constant $a_b$ of the base layer and the lattice constant $a_{e2}$ of the second emitter layer satisfied the relationship of $a_c > a_b > a_{e2}$. The lattice mismatch ratio of the second emitter layer to the base layer was 0.32% which was larger than 0.3%. On the contrary, the lattice mismatch ratio of the first emitter layer to the base layer was 0.05% which was less than 0.1%.

According to this embodiment, the first emitter layer largely contributes characteristics of the HBT (more specifically a band gap of the emitter-base), so that it becomes possible to realize the desired band structure and to maintain the characteristics of the HBT by selecting the material for the first emitter layer appropriately. In addition, according to this embodiment, since the lattice constants of the second emitter layer and the base layer are mismatched with each other such that the second emitter layer has a strain more than 0.3% with respect to the base layer, the strain of the second emitter layer affects the first emitter layer and the base layer to obtain the HBT having the high reliability.

Though the first emitter layer has the thickness of about 25 nm in this embodiment, the first emitter layer preferably have a smaller thickness such as 10 nm or less. Such thin first emitter layer is advantageous in that characteristics of the HBT can be readily controlled while obtaining the high reliability since the first emitter layer is more affected by the second emitter layer.

Furthermore, though the emitter layer was composed of two layers in this embodiment 3, the collector layer may be composed of two layers when the change in a band structure of the collector-base is problematic instead. Moreover, both of the emitter layer and the collector layer may be composed of two layers.

Although the present invention has been explained as above with reference to the embodiments 1 to 3, it will be understood that the present invention is not limited to such embodiments and can be modified in various ways without departing from the scope or spirit of the invention.

What is claimed is:

1. A heterojunction bipolar transistor comprising a collector layer, a base layer and an emitter layer, wherein the collector layer, the base layer and the emitter layer have different lattice constants of $a_c$, $a_b$ and $a_e$ respectively, and a value of $a_b$ is between values of $a_c$ and $a_e$.

2. The heterojunction bipolar transistor according to claim 1, wherein the values of $a_c$, $a_b$ and $a_e$ satisfy a relationship of $a_c > a_b > a_e$.

3. The heterojunction bipolar transistor according to claim 1, wherein the values of $a_c$, $a_b$ and $a_e$ satisfy a relationship of $a_c < a_b < a_e$.

4. The heterojunction bipolar transistor according to claim 1, wherein the heterojunction bipolar transistor is of an emitter-up type, and the values of $a_e$ and $a_b$ satisfy a relationship of $|a_e - a_b|/a_b \times 100 \leq 0.3$ (%).

5. The heterojunction bipolar transistor according to claim 4, wherein the values of $a_e$ and $a_b$ satisfy a relationship of $|a_e - a_b|/a_b \times 100 \leq 0.1$ (%).

6. The heterojunction bipolar transistor according to claim 1, wherein the heterojunction bipolar transistor is of an emitter-up type, and the values of $a_b$ and $a_c$ satisfy a relationship of $|a_b - a_c|/a_c \times 100 \leq 0.3$ (%).

7. The heterojunction bipolar transistor according to claim 6, wherein the values of $a_b$ and $a_c$ satisfy a relationship of $|a_b - a_c|/a_c \times 100 \leq 0.1$ (%).

8. The heterojunction bipolar transistor according to claim 1, wherein the heterojunction bipolar transistor is of a collector-up type, and the values of $a_c$ and $a_b$ satisfy a relationship of $|a_c - a_b|/a_b \times 100 \leq 0.3$ (%).

9. The heterojunction bipolar transistor according to claim 8, wherein the values of $a_c$ and $a_b$ satisfy a relationship of $|a_c - a_b|/a_b \times 100 \leq 0.1$ (%).

10. The heterojunction bipolar transistor according to claim 1, wherein the heterojunction bipolar transistor is of a collector-up type, and the values of $a_b$ and $a_e$ satisfy a relationship of $|a_b - a_e|/a_e \times 100 \leq 0.3$ (%).

11. The heterojunction bipolar transistor according to claim 10, wherein the values of $a_b$ and $a_e$ satisfy a relationship of $|a_b - a_e|/a_e \times 100 \leq 0.1$ (%).

12. The heterojunction bipolar transistor according to claim 1, wherein an InGaP/GaAs heterojunction is applied.

13. The heterojunction bipolar transistor according to claim 1, wherein an InP/InGaAs heterojunction is applied.

14. The heterojunction bipolar transistor according to claim 1, wherein the emitter layer comprises a first emitter layer and a second emitter layer, the first emitter layer is sandwiched between the base layer and the second emitter layer, the first and second emitter layers have lattice constants of $a_{e1}$ and $a_{e2}$ respectively, a value of $a_{e2}$ corresponds to the value of $a_e$, and the values of $a_{e2}$ and $a_b$ satisfy a relationship of $|a_{e2} - a_b|/a_b \times 100 > 0.3$ (%).

15. The heterojunction bipolar transistor according to claim 1, wherein the collector layer comprises a first collector layer and a second collector layer, the first collector layer is sandwiched between the base layer and the second collector layer, the first and second collector layers have lattice constants of $a_{c1}$ and $a_{c2}$ respectively, a value of $a_{c2}$ corresponds to the value of $a_c$, and the values of $a_{c2}$ and $a_b$ satisfy a relationship of $|a_{c2} - a_b|/a_b \times 100 > 0.3$ (%).

16. The heterojunction bipolar transistor according to claim 1, wherein the value of $a_b$ is between the values of $a_c$ and $a_e$ at a junction temperature.

* * * * *